US 11,705,917 B2

(12) United States Patent
Jefremow et al.

(10) Patent No.: US 11,705,917 B2
(45) Date of Patent: Jul. 18, 2023

(54) TIME MEASUREMENT OF A CLOCK-BASED SIGNAL

(71) Applicant: Infineon Technologies AG, Neubiberg (DE)

(72) Inventors: Mihail Jefremow, Augsburg (DE); Ketan Dewan, Unterhaching (DE); Rex Kho, Holzkirchen (DE); Ralph Mueller-Eschenbach, Munich (DE); Juergen Schaefer, Oberhaching (DE)

(73) Assignee: Infineon Technologies AG, Neubiberg (DE)

( * ) Notice: Subject to any disclaimer, the term of this patent is extended or adjusted under 35 U.S.C. 154(b) by 14 days.

(21) Appl. No.: 17/467,767

(22) Filed: Sep. 7, 2021

(65) Prior Publication Data

US 2022/0085824 A1 Mar. 17, 2022

(30) Foreign Application Priority Data

Sep. 14, 2020 (DE) ...................... 10 2020 123 859.2

(51) Int. Cl.
*H03M 1/12* (2006.01)
*G01R 31/317* (2006.01)
*G06F 1/10* (2006.01)

(52) U.S. Cl.
CPC .... *H03M 1/1245* (2013.01); *G01R 31/31709* (2013.01); *G06F 1/10* (2013.01)

(58) Field of Classification Search
CPC ............................... H03M 1/1245; G06F 1/10
USPC ........................................................ 341/155
See application file for complete search history.

(56) References Cited

U.S. PATENT DOCUMENTS

| 2012/0068866 A1* | 3/2012 | Robinson | H03M 1/0836 341/118 |
| 2012/0176179 A1* | 7/2012 | Harders | H03K 17/962 327/509 |
| 2012/0306675 A1* | 12/2012 | Kapusta | H03M 1/0641 341/131 |
| 2013/0162455 A1* | 6/2013 | Mateman | G11C 27/026 341/122 |
| 2019/0131993 A1* | 5/2019 | Bartling | H03M 1/109 |

OTHER PUBLICATIONS

Adaptive and Digital Blind Calibration of Transfer Function Mismatch in Time-Interleaved ADCs; De Teyou et al.; pp. 1-4; IEEE; 2015.*
Wikipedia; "Sample and hold"; Web Article; https://en.wikipedia.org/wiki/Sample_and_hold ; Published on Aug. 10, 2020.

* cited by examiner

*Primary Examiner* — Peguy Jean Pierre
(74) *Attorney, Agent, or Firm* — Eschweiler & Potashnik, LLC

(57) ABSTRACT

A device is provided for time measurement of a clock-based signal comprising a sample stage comprising a switching device that is driven by a control signal and a capacitance (Cs), wherein the sample stage is arranged to transform an analog input signal in an analog output signal, the device further comprising an analog-to-digital converter to convert the analog output signal into a digital output signal, wherein the input signal applied to the sample stage is a reference signal and wherein the clock-based signal is applied to the control signal. Also, an according method is suggested.

20 Claims, 7 Drawing Sheets

TIME MEASUREMENT OF A CLOCK-BASED SIGNAL

REFERENCE TO RELATED APPLICATION

This application claims priority to German Application No. 10 2020 123 859.2, filed on Sep. 14, 2020, the contents of which are hereby incorporated by reference in their entirety.

BACKGROUND

A sample and hold circuit samples (captures, takes) the voltage of a continuously varying analog signal and holds (locks, freezes) its value at a constant level for a specified minimum period of time. Such sample and hold circuit may be used as an entry stage of an analog-to-digital converter to eliminate variations in the input signal that could otherwise corrupt the conversion process. A simplified sample and hold circuit has a switching device (e.g., a field effect transistor) that is driven by a control signal and a capacitor to store a load conveyed via the switching device.

A system, e.g., a radar system or any electronic control unit (ECU) in the automotive field may require at least one clock source. Such clock source may be realized as an external clock source that is used by at least one microcontroller. The system integration, however, may impact the signal quality of the clock signal, in particular if it has to be conveyed to the microcontroller or from the microcontroller to at least one other component of the system. Hence, the clock signal may have experienced a distortion when it arrives at its destination. Such deterioration or jitter may violate a predefined margin for mass production and hence the quality requirement of the system.

Another problem is the deterioration of the clock signal in view of safety aspects. One aspect in this regard relates to a clock generation tree, i.e. several clock signals that may be derived from a single clock source and may partially be derived from each other. For safety reasons it might be important to know whether or not the clock signals stay within a predefined margin of error. Due to increasing jitter propagating across several dependent clock signals, the deterioration may lead to an increased bit error rate in high speed communication interfaces like HSCT, Gbit Ethernet or the like.

SUMMARY

The examples suggested herein may in particular be based on at least one of the following solutions. Combinations of the following features may be utilized to reach a desired result. The features of the method could be combined with any feature(s) of the device, apparatus or system or vice versa.

A device for time measurement of a clock-based signal is provided, said device comprising: a sample stage comprising a switching device that is driven by a control signal and a capacitance (Cs). The sample stage is arranged to transform an analog input signal in an analog output signal. An analog-to-digital converter converts the analog output signal into a digital output signal. The input signal applied to the sample stage is a reference signal. The clock-based signal is applied to the control signal.

The clock-based signal may be any signal representing a time information. The clock-based signal may in particular be a digital signal.

The sample stage may be a sample and hold circuit. The switching device may be an electronic switch, in particular a field effect transistor).

The clock-based signal may be a clock signal or a signal that is based on or derived from a clock signal. The clock signal may be used to operate the device. As an alternative or in addition, the clock signal may be used to be transformed in a different clock signal (with, e.g., a different frequency). As an alternative or in addition, the clock-based signal or any signal derived therefrom may be propagated to at least one other device.

Hence, the clock-based signal is used to drive the switching device of the sample stage.

The capacitance of the sample stage is used for accumulating charge during the time the switching device is closed. The capacitance may be large enough to not fill up during a single cycle or period of the clock-based signal. This allows for digital output signals that are different from each other and that are smaller than a digital output signal that corresponds to the reference signal. In other words, the clock-based signal controls the length of the sampling operation thereby leading to different output values for different clock-based signals.

The device may be a microcontroller or any processing device. The device may be part of an ADC or the device may comprise an ADC. The device may also be a component separate to an ADC.

According to an embodiment, the reference signal comprises at least one of the following: a reference voltage; a reference current.

According to an embodiment, the clock-based signal is or is based on a clock signal provided by a component external to the device.

According to an embodiment, the clock-based signal has a duration of a single clock period or the duration of several clock periods.

According to an embodiment, the capacitance is (at least partially) discharged after each digital output signal or after several output signals.

Also, a method is suggested for time measurement of a clock-based signal comprising a sample stage comprising a switching device that is driven by a control signal and a capacitance, wherein the method comprises: transforming by the sample stage an analog input signal in an analog output signal, and converting by an analog-to-digital converter the analog output signal into a digital output signal. The input signal applied to the sample stage is a reference signal. The clock-based signal is applied to the control signal.

The value of the digital output signal is a measure for the clock-based signal.

According to an embodiment, the reference signal comprises at least one of the following: a reference voltage; a reference current.

According to an embodiment, the clock-based signal is or is based on a clock signal provided by another component.

According to an embodiment, the clock-based signal has a duration of a single clock period or the duration of several clock periods.

According to an embodiment, the capacitance is (at least partially) discharged after each digital output signal is determined or after several output signals are determined.

According to an embodiment, the method further comprises: determining a number of N digital output signals for a number of N clock-based signals, determining a difference between digital output signals, and determining a predefined action based on the difference determined.

The difference between digital output signals may result in a distribution of digital output signals indicating a quality of the clock-based signal.

According to an embodiment, the predefined action may be triggering an alarm or a notification, controlling the sample stage and/or the analog-to-digital converter and/or triggering a redesign.

Also, a system or a control unit is/are suggested, each comprising at least one device as described herein.

The system may be a vehicle, in particular a car. The control unit may be an electronic control unit (ECU) of a vehicle.

In addition, a device is provided comprising at least one processing unit that is arranged to conduct the steps of the method as described herein.

DRAWINGS

Embodiments are shown and illustrated with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

Due to the potential impairments affecting a clock signal, it may be necessary or at least advantageous to be able to measure and detect the quality of the clock signal even after an actual system integration, i.e. in the final application or product during runtime. This is rather difficult due to the overall noise situation in the active system. For example, if an ECU is integrated and running in a dense environment, it is difficult to determine whether a predefined jitter margin of a clock signal can be maintained.

Examples described herein may be used to flexibly monitor clock signals. The result of such monitoring can then be used to determine whether the system integration meets its requirements, e.g., whether microcontrollers that use external clock signals experience jitter beyond a predefined threshold.

Herein, the microcontroller is mentioned merely as an exemplary electronic component that is driven by a clock source that is external to this microcontroller. The clock source may drive several microcontrollers. Also, the clock source may provide a clock signal to a first microcontroller that further propagates the clocks signal to a second microcontroller etc. It is also an option that the first microcontroller conducts a conversion and propagates a clock signal to the second microcontroller that has a different frequency compared to the frequency of clock signal of the clock source. Due to the propagation and/or the frequency transformation, the second microcontroller may experience a jitter that is significantly higher compared to a jitter that is experienced by the first microcontroller.

It is noted that the microcontroller is only an exemplary electronic component. Other components may be used instead or in combination with such microcontroller(s). Examples for such electronic components that may be driven by an external clock signal are: MMICs (monolithic microwave integrated circuit), silicon microphone ICs, power management modules and high-speed PHY ICs.

Figure 1:
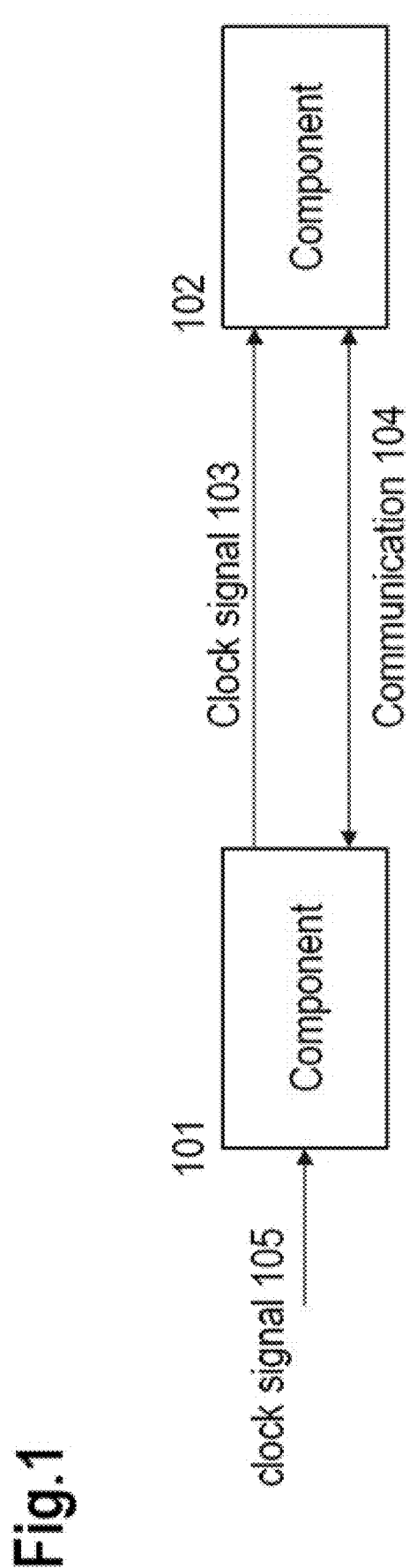
FIG. 1 shows an exemplary block diagram showing a first component providing a clock signal to a second component, wherein the clock signal may be affected by jitter when arriving at the second component.

FIG. 1 shows an exemplary block diagram comprising two components 101 and 102, wherein the component 101 is supplied with an external clock signal 105 (provided by an external clock source). The component 101 supplies a clock signal 103 (based on the external clock signal 105) to the component 102. Also, there is a communication channel 104 between the components 101 and 102.

The component 101 may be a microcontroller operating in a master mode and the component 102 may be a microcontroller operating in a slave mode.

The clock signal 105 may be a 20 MHz signal that drives the component 101 and is fed from the component 101 towards the component 102. However, due to the connection (e.g., the length of the cable or conducting path on a printed circuit board (PCB)) between the component 101 and 102 the clock signal is subject to a deterioration (e.g., jitter) that may impact the performance of the component 102 and thus the performance of the overall system.

The solution presented herein in particular allows assessing the clock signal at the respective component to evaluate the robustness and performance of the circuit design. This may be used to confirm that a circuit design is well suited for mass production or it may even trigger a change of the circuit design and/or a change of how the circuit is controlled in order to meet its requirements, in particular for mass production.

The approach may in particular apply for synchronous interfaces (e.g., High Speed Communication Tunnel (HSCT), Ethernet, Peripheral Component Interconnect Express (PCIe)).

It is also an option that the component 101 produces a clock signal 103 that is different from the clock signal 105. For example, the clock signal 105 may have a frequency of 20 MHz and the clock signal 103 may have a frequency amounting to 125 MHz, which is generated by the component 101 by transforming the clock signal 105. This approach allows saving Bill Of Material (BOM) costs as no 125 MHz clock source (e.g., crystal) is required. In this scenario, the clock quality degrades more severely with higher frequencies, which makes it even more crucial to become aware of any deteriorating effects affecting the components and thus the overall system.

In another example, the component 101 may be a Monolithic Microwave Integrated Circuit (MMIC) and the component 102 may be a microcontroller. The clock signal 105 may have a frequency of 50 MHz and the clock signal 103 may also have a frequency amounting to 50 MHz.

In yet another example, the component 101 may be a microcontroller and the component 102 may be a PCIe peripheral. The communication 104 in this case may enable transfer rates in the range up to Gbit/s. Hence, it is important to be able to assess the quality of the clock signal in order to reliably allow for such high transfer rates.

Examples described herein may use a sample-hold structure to convert a time into a voltage signal and then convert the voltage signal into a digital signal. This is also referred to as time-to-digital converter (TDC).

In other words, to measure a clock signal that has a timing that is subject to jitter, this clock signal is used to drive a sample-hold structure thereby converting the timing of the clock signal to a voltage, which is then sampled by an analog-to-digital converter (ADC). This allows becoming aware of the timing differences of clock periods of the clock signal, which are indicative of the jitter of the clock signal.

This approach is beneficial, because an existing ADC structure of a microcontroller may be used to create the TDC signal.

Figure 2A:
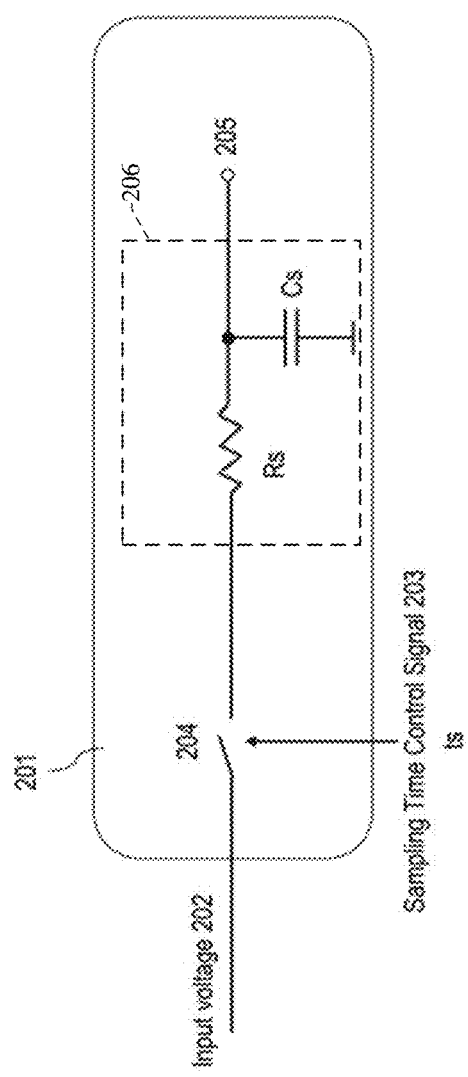
FIG. 2A shows a symbolic diagram of an exemplary sample stage of an analog-to-digital converter (ADC)
Figure 2B:
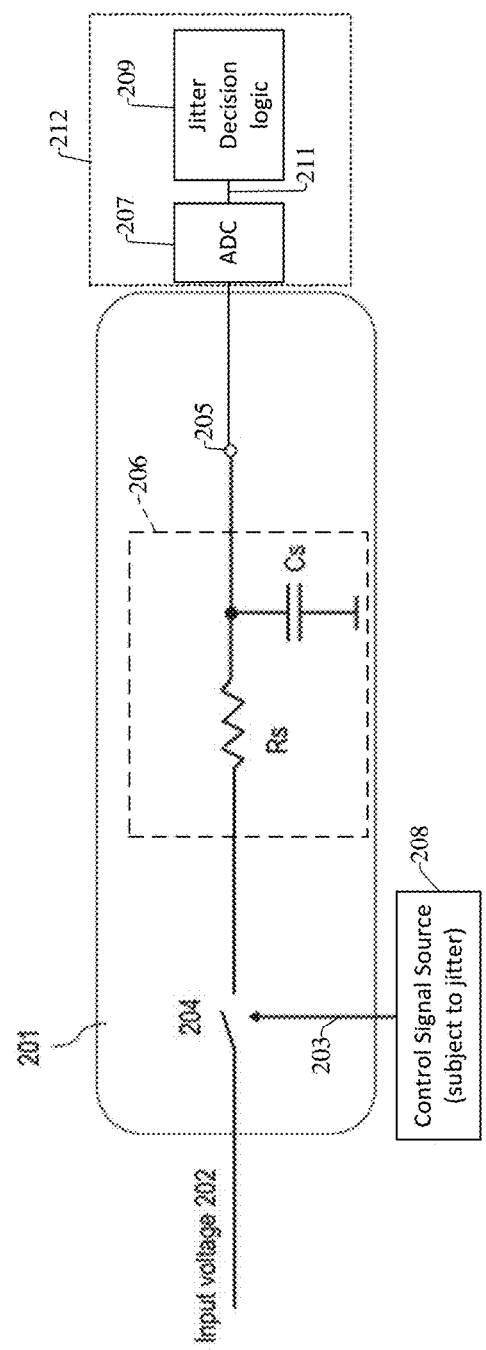
FIG. 2B shows a symbolic diagram of an exemplary circuit including an example sample stage of an ADC as well as an ADC and a jitter decision circuit block

FIG. 2A shows a symbolic diagram of an exemplary sample stage 201 of an ADC. This sample stage 201 may be the sample-and-hold circuit of an ADC. The ADC may comprise the circuit of FIG. 2A or the ADC may be a separate component that utilizes the output of the circuit of FIG. 2A. For example, FIG. 2B shows another example where the exemplary sample stage 201 is coupled to an input terminal of controller 212. The controller 212 can manifest as an ADC 207, and the output of the ADC 207 can be coupled to an input of a jitter decision logic block 209. The jitter decision logic block 209 can manifest as a microprocessor circuit, an application specific integrated circuit (ASIC), and/or another circuit. In other embodiments, the controller 212 can be other analog circuitry and/or digital circuitry to perform a comparison to evaluate whether jitter is present.

In FIG. 2A, an input voltage 202 is to be sampled by using a sampling time control signal 203 to drive a switch 204. This sampling time control signal 203 is also referred to as ts and it may be provided by the ADC. The switch 204 may be a switching element, e.g., a field effect transistor, and it is connected between the input voltage 202 and a series connection of a resistor Rs and a capacitor Cs to ground. Thus, the resistor and the capacitor establish an RC circuit 206, though other RC circuits other than what is illustrated are contemplated as falling within the scope of this disclosure. A sampled voltage is obtained at a node 205 between the resistor Rs and the capacitor Cs. For example, in FIG. 2B, a control signal source 208, which can manifest for example as a clock line that is subject to jitter, provides the sampling time control signal 203 to control terminal of switch 204. The ADC 207 obtains a sampled voltage at node 205, and converts the sampled voltage to a digital value 211. The sampled voltage at node 205 changes in time to correspond to time-varying digital values 211, which are indicative of the jitter of the sampling time control signal 203. The jitter decision logic 209 can then determine a jitter of the sampling control time signal 203 based on the time-varying digital values 211, and/or can determine or carry-out a predefined action based on the jitter. The predefined action may be triggering an alarm or a notification, controlling the sample stage and/or the analog-to-digital converter, and/or triggering a redesign.

The resistor Rs may correspond to a resistance of the transmission gate of the ADC, wherein the ADC may be an SAR-ADC (successive-approximation ADC). The capacitor Cs may be a sample capacitance of the SAR-ADC.

Figure 3:
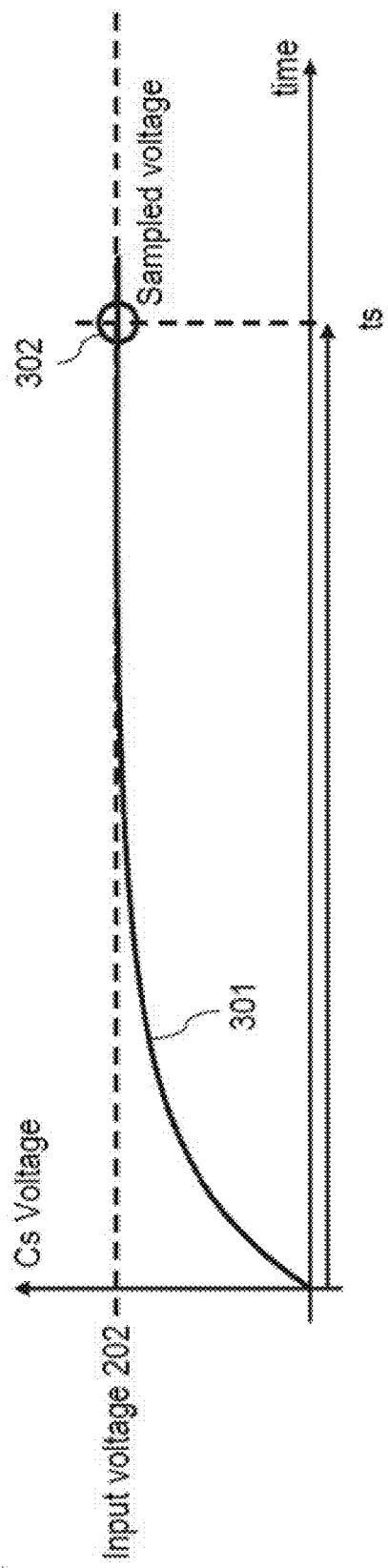
FIG. 3 shows an exemplary sampling diagram for the circuit of FIG. 2.

FIG. 3 shows an exemplary sampling diagram for the circuit of FIG. 2A. The y-axis illustrates the voltage at the capacitor Cs and the x-axis indicates the time. A curve 301 shows a sampling curve and ts indicates the sampling time that drives the switch 204. When the sampling time ts is reached, the input voltage 202 is sampled ("captured"), i.e. the input voltage 202 corresponds to a sampled voltage, indicated by a reference 302.

The sampling time ts has to be long enough for the curve 301 to reach the input voltage 302. As an example, the sampling time ts may amount to $$ts \geq 10 \cdot \tau$$

with $$\tau = Rs \cdot Cs.$$

Figure 4:
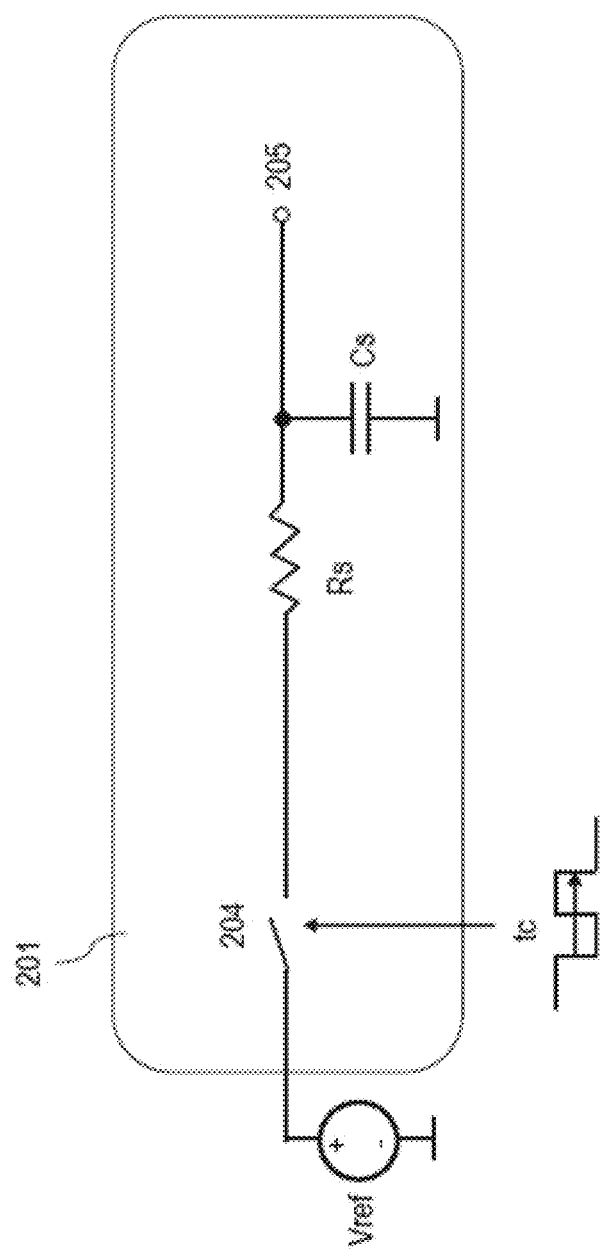
FIG. 4 shows an approach to measure a clock signal utilizing a sample-and-hold circuit.

FIG. 4 shows an approach to measure a clock signal that has a clock period tc. The clock signal may be a square-wave signal. The exemplary sample stage 201 can be used by applying a reference voltage Vref via a voltage source instead of the input voltage 202 shown in FIG. 2.

As an alternative, a reference current source can be used instead of the reference voltage source. The current source can be used to integrate the charge on the capacitor Cs during the time the switch 204 is closed. In the scenario using the current source, the measurement time period indicated by the clock period tc (or multiples thereof) may advantageously be smaller than $$Cs \cdot \frac{V\max}{Is},$$

wherein Vmax is the maximum input voltage and Is is the current supplied by the current source.

Figure 5:
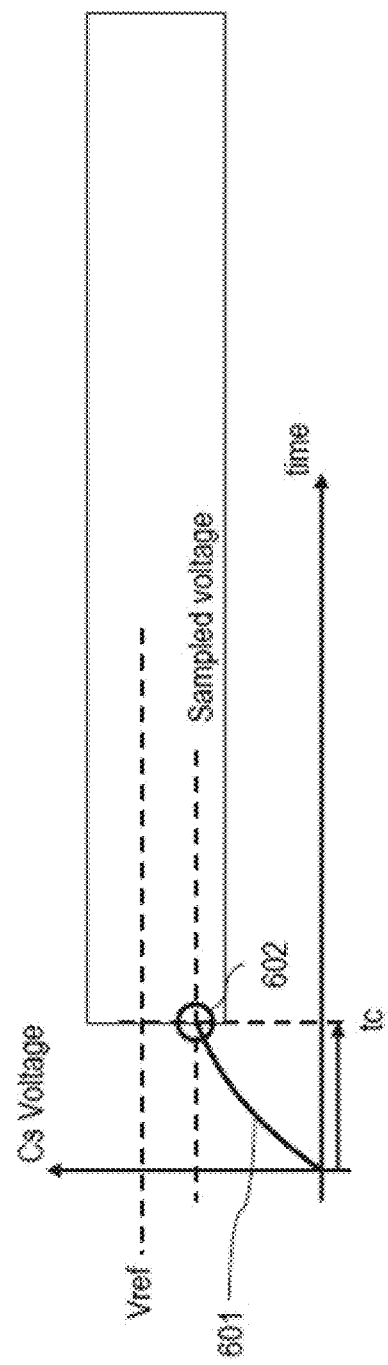
FIG. 5 shows an exemplary sampling diagram for the circuit of FIG. 4.

FIG. 5 shows an exemplary sampling diagram for the circuit of FIG. 4. The y-axis illustrates the voltage at the capacitor Cs and the x-axis indicates the time. A curve 601 shows a sampling curve and tc indicates the clock period, which corresponds to the sampling time shown in FIG. 3.

During the clock period tc the reference voltage Vref is sampled. When the clock period tc is over, a sampled voltage is reached, indicated by a reference 602. Hence the value of the sampled voltage (which depends on the duration of the clock period tc) is a measure for the clock period tc. Different clock periods lead to different sampled voltages thereby allowing to measure any divergence (e.g., jitter) between clock periods.

Next, an ADC may convert the analog value of the sampled voltage into a digital value.

The clock period tc may advantageously be significantly smaller than 10·τ. Therefore, the sampled voltage is lower than the reference voltage Vref, which enables measuring the clock period tc and to compare different values of clock periods.

It is an option that multiple clock periods tc are used instead of a single clock period as a sample time to drive the switch 204.

As an option, a discrepancy between clock periods may be determined and compared to a predefined threshold to determine whether the respective clock period exceeds or falls below a predefined range.

Figure 6:
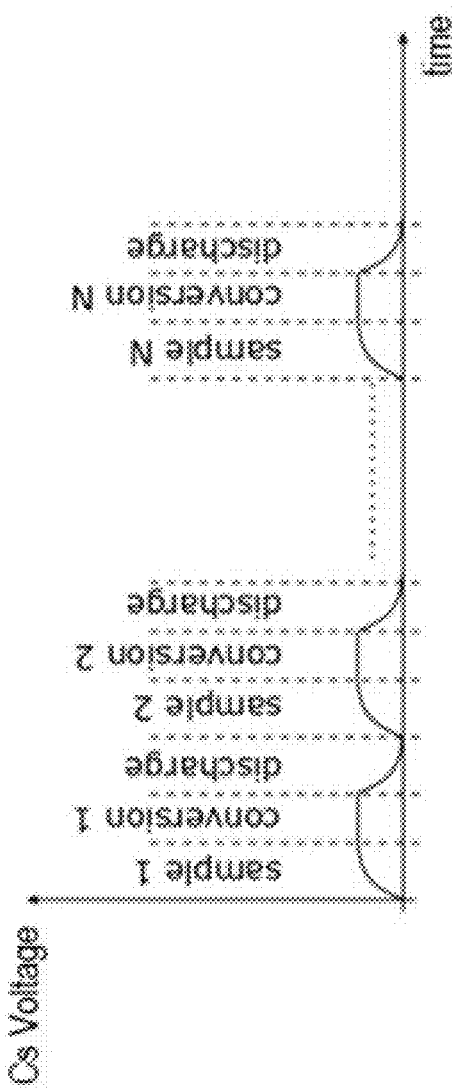
FIG. 6 shows a timing diagram that visualizes how various sample voltages can be determined for different clock periods.

FIG. 6 shows a timing diagram that visualizes how various sample voltages can be determined for different clock periods tc.

In FIG. 6, "sample 1" indicates a sampling of first clock period, which during a phase "conversion 1" is converted into a digital value, then the capacitor Cs is discharged. Next, "sample 2" indicates a sampling of a subsequent clock period, which during a phase "conversion 2" is converted into a digital value, then the capacitor Cs is discharged. This may be repeated until a value N for the N-th sample is reached and converted. The subsequent clock period may be a clock period after conversion 1 and discharge have been conducted.

In this example, the capacitor Cs is charged and discharged after each conversion. The sample times may vary depending on the actual clock period. The variation of the sample times leads to different digital values. This allows a jitter to become apparent based on the differences between the digital values, i.e. the digital values that result from (different durations of the) clock periods.

Figure 7:
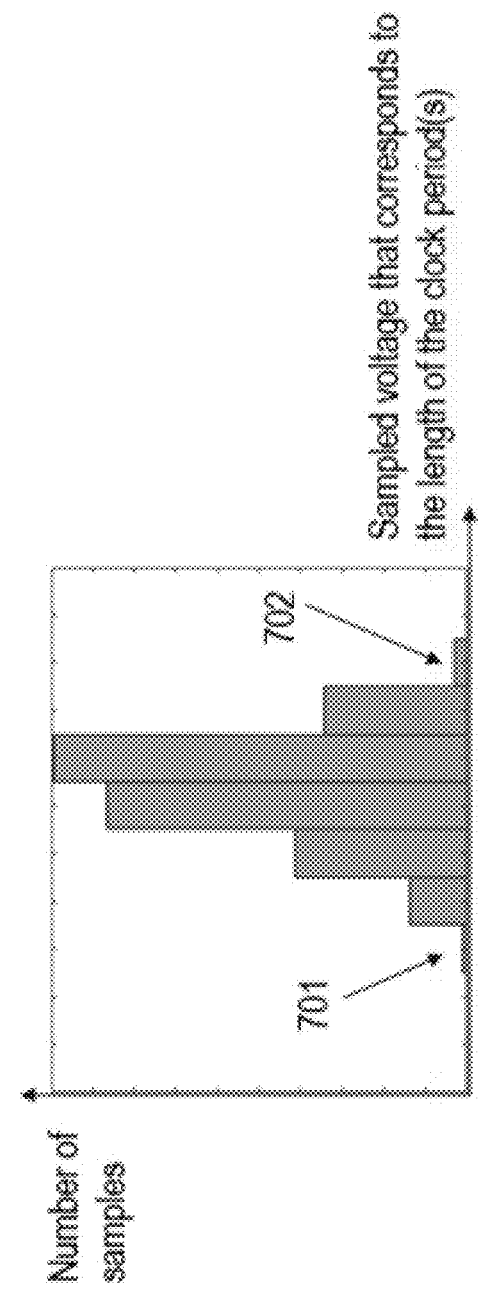
FIG. 7 shows a distribution of samples.

FIG. 7 shows a distribution of samples (digital values), wherein the y-axis depicts the number of samples (i.e. number of clock periods) and the x-axis shows the value of the sampled voltage that corresponds to the length of the clock period. Hence, FIG. 7 allows determining the distribution of sampled digital clock period values, wherein a breadth defined by several columns is an indication of the size of the jitter. For example, an arrow 701 shows short clock periods that occur rather rarely and an arrow 702 shows long clock periods that also occur rather rarely, wherein "short" and "long" in this respect each refers to the distance from the center of the distribution, i.e. the column in (or around) the middle of the distribution.

In an ideal system, all clock periods would produce the same sampled value leading to merely a single peak. In a real-world application, the exemplary distribution of FIG. 7 occurs indicating that the sampled digital clock periods do not all show the same value, but at least in part deviate from an ideal value. Hence, the distribution allows measuring a disturbance affecting the (ideal) clock signal. For example, the distance between the arrows 701 and 702 and/or a standard deviation may indicate the quality of the clock signal and hence its impact on the respective component and/or system. Due to the distribution it can be reliably decided whether the system integration needs to be changed or whether the deterioration is within an acceptable range.

Figure 8:
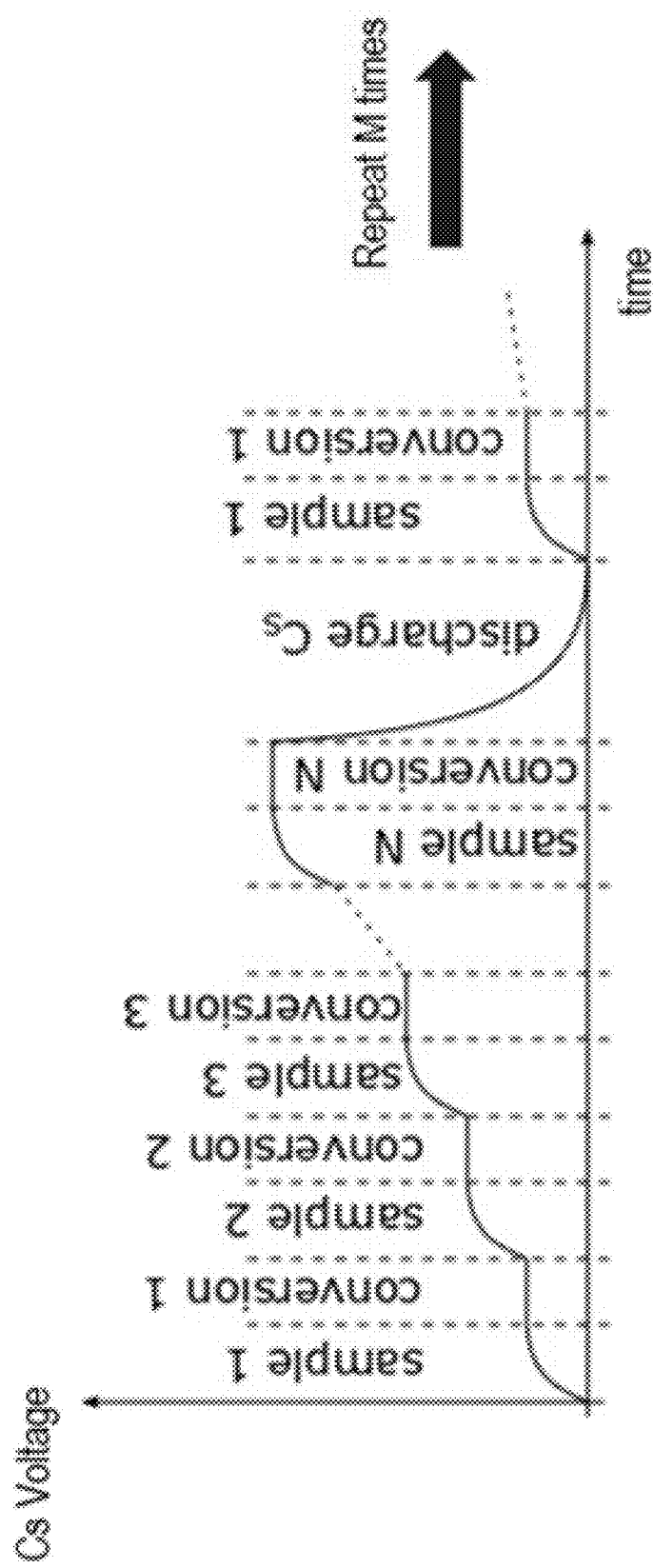
FIG. 8 shows an alternative sampling scheme compared to FIG. 6.

FIG. 8 shows an alternative sampling scheme compared to FIG. 6. Here, the capacitor Cs is discharged after N samplings/conversions. In this example N may refer to N clock periods, i.e. N·tc.

This may be repeated M times resulting in M accumulated digital values, wherein each digital value corresponds to N clock periods.

A distribution of the M digital values may be assessed as described before with regard to FIG. 7 thereby allowing to decide whether a re-design is needed to meet the requirements for the clock signals.

Figure 9:
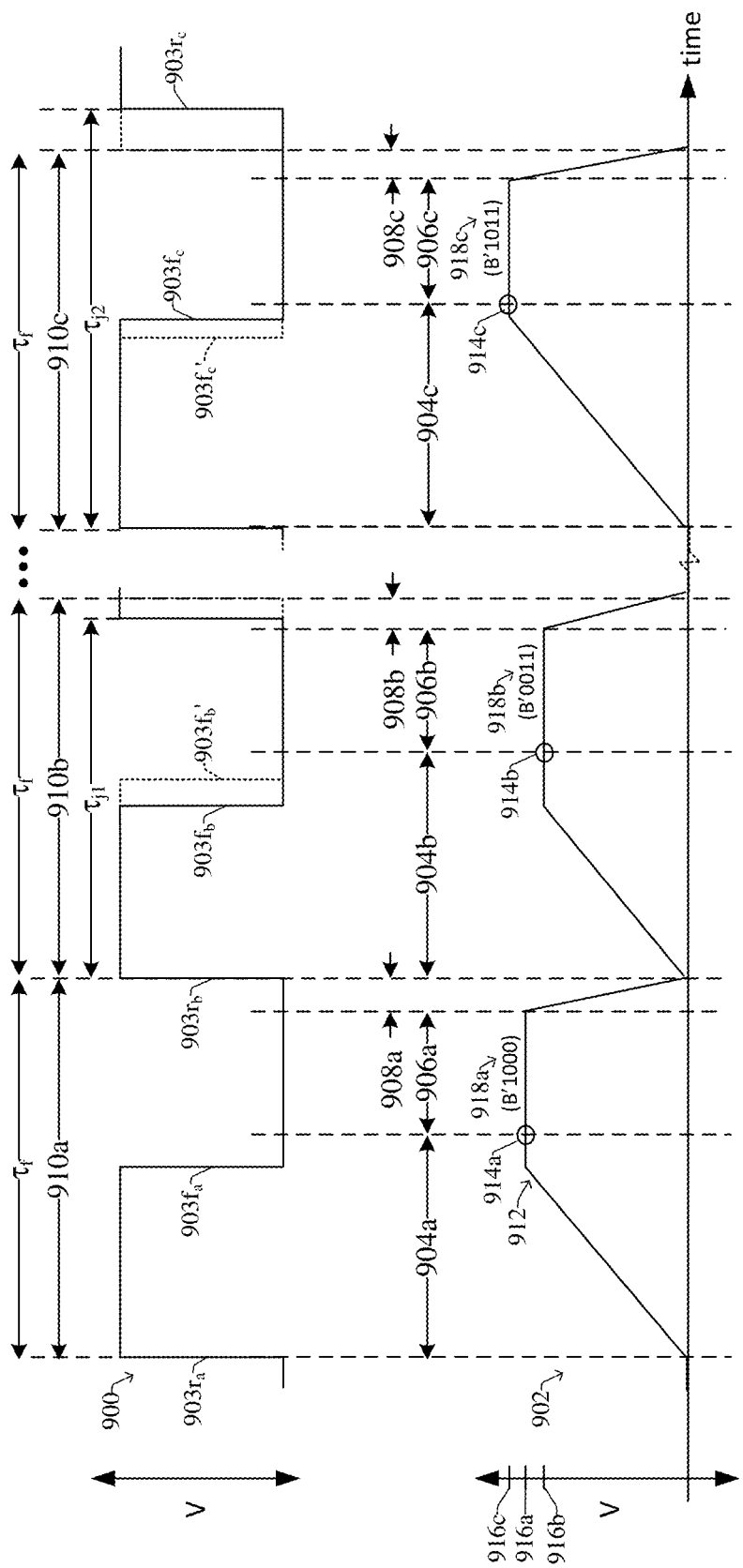
FIG. 9 shows an example timing diagram of a clock signal that has a timing that is subject to jitter and of a sampled voltage signal that is based on the clock signal.

FIG. 9 includes an upper portion showing an example of a clock signal 900 that has a timing that is subject to jitter, and a lower portion showing a sampled voltage signal 902 corresponding to the clock signal 900. The x-axis (time) is aligned for the upper and lower portions of FIG. 9, such that vertical lines extending between the upper and lower portions indicate the same times in the upper and lower portions. In some embodiments, the clock signal 900 can correspond to the sampling time control signal (e.g., 203 of FIGS. 2A-2B), and the sampled voltage signal 902 can correspond to the sampled voltage on an input of an ADC (e.g, node 205 in FIGS. 2A-2B).

In the upper portion of FIG. 9, the clock signal 900 includes rising edges (e.g., $903r_a$-$903r_c$ and falling edges ($903f_a$-$903f_c$), which generally correspond to an fundamental clock period τf. Although the rising and falling edges in FIG. 9 are illustrated as vertical lines, in other embodiments the rising and falling edges could be offset from vertical (e.g., slanted or diagonal), could be rounded, and/or could take other forms, and thus, FIG. 9 is merely an example; and the same is true for the ample voltage signal 907. In some ideal cases, the rising and falling edges are aligned precisely to the start time and end time of a given fundamental clock period $τ_f$, giving rise to an clock frequency that has a single frequency peak equal to $1/τ_f$. For example, in FIG. 9, a first clock period 910a has rising edge ($903r_a$) and falling edge ($903f_a$) that are aligned to the start time and end time of each cycle of the fundamental clock period $τ_f$. However, in many real-world cases at least some of the rising and/or falling edges of the clock signal 900 deviate from their ideal positions according to a jittter. This jitter can be due to deterministic changes (e.g., changes in loads in the system, such as a component turning on), or due to random changes (e.g., random thermal changes in the system). Thus, in a second period 910b of clock signal, the falling edge (ideally expected at $903f_b'$) is slightly premature and occurs at $903f_b$, causing the duty cycle of the clock to end before the end of the fundamental clock period $τ_f$. Further, in a third period 910c of the clock signal, the rising edge (ideally expected at $903r_c'$) is slightly late and occurs at $903r_c$ after the end of the fundamental clock period $τ_f$. Thus, although the clock signal in FIG. 9 has a fundamental clock frequency of $1/τ_f$, the clock signal also exhibits a jitter, which can be represented in terms of various jitter periods ($τ_{j1}$, $τ_{j2}$) and/or jitter frequencies ($1/τ_{j1}$, $1/τ_{j2}$) that may change in time.

When the clock signal 900 is applied to the control terminal of a switching device (e.g., 204 in FIG. 2A-2B) to drive an RC circuit (e.g., 206 in FIG. 2A-2B), the sampled voltage 902 can be provided at an output node of the RC circuit (e.g., 205 in FIG. 2A-2B). Some examples of how this sampled voltage 902 changes over the first, second, and third clock periods 910a, 910b, and 910c and how it can be used to characterize jitter is now described below. In general, each of these clock periods will include a sampling interval (e.g., 904a, 904b, 904c), a conversion interval (e.g., 906a, 906b, 906c), and a discharge interval (e.g., 908a, 908b, 908c).

During a first sampling interval 904a, the switching device 204 is closed due to the clock signal 900 being high, and the RC circuit is correspondingly charged by a current source or a voltage source that provides an input current or input voltage (e.g., 202 in FIG. 2A-2B). Thus, during the first sampling interval 904a, the sampling voltage 902 increases while the clock signal 900 is high. Because the first sampling interval 904a is longer than the first half of the clock period 910a during which the clock signal 900 is high, the sampling voltage 902 flattens out at 912 before the end of the first sampling interval 904a at a first sampling voltage value 914a. This first sampling voltage value 914a has a magnitude 916a that is indicative of the jitter, if any, of the clock signal 900 duing the first period 910a of the clock signal. Thus, this first sampling voltage value 916a can be converted by an ADC to a first multi-bit digital value 918a (e.g., binary B'1000 in FIG. 9's example), after which the capacitor of the RC circuit is discharged during discharge time 908a.

During a second sampling interval 904b, the RC circuit is again charged while the clock signal 900 is high. During second sampling interval 904b (which can be equal in duration to the first sampling interval 904a), the clock signal 900 falls prematurely (see 903fb and 903f2b'), such that when a second sampling voltage value 914b is taken, this second sampling voltage value 914b has a second magnitude 916b that is less than the first magnitude 916a. This second magnitude 916b is less than the first magnitude 916a due to jitter shortening the charging time of the RC circuit during the second sampling interval 904b. The second sampling voltage 914b is then converted to a second multi-bit digital value 918b (e.g., B'0011 in FIG. 9). The second multi-bit digital value 918b thus differs from the first multi-bit digital value 918a to be indicative of the jitter.

During a third sampling interval 904c, the RC circuit is again charged while the clock signal 900 is high. In some embodiments a charging curve can be the same for each of the first, second, and third sampling intervals 904a-904c, albeit truncated due to to differences in clock rising and falling edges from jitter. During third sampling interval 904c (which can be equal in duration to the first sampling interval 904a and second sampling interval 904b), the clock signal 900 later than the ideal clock period (see 903fc and 903fc'), such that when a third sampling voltage value 914c is taken, this third sampling voltage value 914c has a third magnitude 916c that is greater than the first magnitude 916a and is greater than the second magnitude 916b. This third magnitude 916c is greater than the first magnitude value 916a and second magnitude value 916b due to jitter lengthening the charging time of the RC circuit during the third sampling interval 904c. The third sampling voltage 914c is then converted to a third multi-bit digital value 918c (e.g., B'1011 in FIG. 9). The third multi-bit digital value 918c thus differs from the first multi-bit digital value 914a to be indicative of the jitter.

Jitter decision logic (e.g., FIG. 2A-2B 209) can then determine if one of more of the first, second, and/or third multi-bit digital values 918a, 918b, 918c exceed some predetermined threshold value, or if a difference between the first, second, and/or third multi-bit digital values exceed some predetermined threshold value, thereby determining a jitter of the sampling control time signal 203. and/or deciding on or carrying-out a predefined action based on the jitter. The predefined action may be triggering an alarm or a notification, controlling the sample stage and/or the analog-to-digital converter, and/or triggering a redesign.

An advantage of this solution is that it allows using existing components of a microcontroller, which can be extended by adding or amending software and/or firmware. Hence, the solution presented may be realized efficiently at low costs.

Another advantage is based on the capability that the assessment of the clock signal deterioration can be done in an actual implementation during runtime without having to add complex and expensive test installations. Hence, a manufacturer may test an ECU in its targeted application during runtime, e.g., in a car when it is driving, thereby monitoring clock signals and/or deviations of clock signals from predefined values. The approach allows testing, monitoring and/or verifying at high accuracy.

Basically, the approach presented may be used in connection with any high precision time measurement.

An exemplary application of the solution may be in the automotive area, e.g., a microcontroller that is implemented in an ECU of a car.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

The invention claimed is:

1. A device for time measurement of a clock-based signal comprising:
   a sample stage arranged to transform an analog input signal to an analog output signal and comprising:
      a switching device that is driven by a control signal, wherein the clock-based signal is applied to the control signal, and
      a capacitance (Cs) at an analog output on which the analog output signal is provided,
   an analog-to-digital converter coupled to the analog output and configured to convert the analog output signal into a digital output signal, and
   a controller coupled to the analog-to-digital converter and configured to determine a jitter of the clock-based signal based on the digital output signal.

2. The device according to claim 1, wherein the analog input signal comprises at least one of the following:
   a reference voltage;
   a reference current.

3. The device according to claim 1, wherein the clock-based signal is or is based on a clock signal provided by a component external to the device.

4. The device according to claim 1, wherein the clock-based signal has a duration of a single clock period or a duration of several clock periods.

5. The device according to claim 1, wherein the capacitance is discharged after each digital output signal or after several output signals.

6. A system or a control unit comprising at least one device according to claim 1.

7. A method for time measurement of a clock-based signal comprising a sample stage comprising a switching device that is driven by a control signal and a capacitance (Cs), wherein the method comprises:
   transforming by the sample stage an analog input signal in an analog output signal,
   wherein the analog input signal applied to the sample stage is a reference signal,
   wherein the clock-based signal is applied to the control signal,
   converting by an analog-to-digital converter the analog output signal into a digital output signal;
   determining a number of N digital output signals for a number of N clock-based signals,
   determining a difference between a first of the number of N digital output signals and a second of the number of N digital output signals,
   determining a predefined action based on the difference determined.

8. The method according to claim 7, wherein the reference signal comprises at least one of the following:
   a reference voltage;
   a reference current.

9. The method according claim 8, wherein the clock-based signal is or is based on a clock signal provided by another component.

10. The method according to claim 9, wherein the clock-based signal has a duration of a single clock period or a duration of several clock periods.

11. The method according to claim 10, wherein the capacitance is discharged after each digital output signal is determined or after several output signals are determined.

12. The method according to claim 7, wherein the predefined action may be triggering an alarm or a notification, controlling the sample stage and/or the analog-to-digital converter and/or triggering a redesign.

13. A device comprising at least one processing unit that is arranged to conduct the method according to claim 12.

14. The method according to claim 7, further comprising:
determining a jitter of the control signal based on the digital output signal.

15. A device comprising:
a switching device having a first terminal, a second terminal, and a control terminal;
a current source or voltage source coupled to the first terminal of the switching device;
a resistor capacitor (RC) circuit comprising an input RC terminal and an output RC terminal, the input RC terminal coupled to the second terminal of the switching device;
a clock source coupled to the control terminal of the switching device, the clock source configured to provide a clock signal to the control terminal to selectively couple the current source or the voltage source to the input RC terminal of the RC circuit, such that the RC circuit outputs a plurality of sampled voltages in time and the plurality of sampled voltages have different voltage values that collectively indicate a jitter of the clock source; and
a controller configured to determine the jitter of the clock signal based on the different voltage values of the plurality of sampled voltages.

16. The device of claim 15, wherein the jitter of the clock source has at least two clock periods having at least two lengths, respectively, which differ from one another due to the jitter, and the at least two lengths correspond to at least two different voltage values, respectively for the plurality of sampled voltages.

17. The device of claim 16, wherein the controller further comprises:
jitter decision logic configured to determine or carry-out a predefined action based on the jitter.

18. The device of claim 15, wherein the controller comprises:
an analog-to-digital converter (ADC) coupled to the output RC terminal and configured to output a plurality of digital values corresponding to the different voltage values, respectively.

19. The device of claim 18, wherein the jitter of the clock source has at least two clock periods having at least two lengths or duty cycles, respectively, which differ from one another due to the jitter, and at least two digital values of the plurality of digital values are indicative of the at least two lengths or duty cycles, respectively.

20. The device of claim 19, wherein the controller further comprises:
jitter decision logic configured to determine or carry-out a predefined action based on the jitter.

* * * * *